United States Patent
Weinberg (10) Patent No.: US 9,411,030 B2
(45) Date of Patent: Aug. 9, 2016

(54) APPARATUS AND METHOD FOR DECREASING BIO-EFFECTS OF MAGNETIC GRADIENT FIELD GRADIENTS

(75) Inventor: Irving N. Weinberg, Bethesda, MD (US)

(73) Assignee: WEINBERG MEDICAL PHYSICS LLC, Bethesda, MD (US)

( * ) Notice: Subject to any disclaimer, the term of this patent is extended or adjusted under 35 U.S.C. 154(b) by 959 days.

(21) Appl. No.: 13/439,382

(22) Filed: Apr. 4, 2012

(65) Prior Publication Data

US 2012/0223711 A1      Sep. 6, 2012

Related U.S. Application Data (63) Continuation-in-part of application No. 12/488,105, filed on Jun. 19, 2009, now Pat. No. 8,154,286.

(60) Provisional application No. 61/074,397, filed on Jun. 20, 2008.

(51) Int. Cl.
  *G01V 3/00*   (2006.01)
  *G01R 33/385*  (2006.01)
  *G01R 33/28*   (2006.01)

(52) U.S. Cl.
  CPC .......... *G01R 33/3852* (2013.01); *G01R 33/288* (2013.01)

(58) Field of Classification Search
  USPC .......... 324/300–322; 600/407–435; 382/128–131
  See application file for complete search history.

(56) References Cited

U.S. PATENT DOCUMENTS

| | | | |
|---|---|---|---|
| 5,145,163 A | 9/1992 | Cowan et al. | |
| 5,442,290 A | 8/1995 | Crooks | 324/309 |
| 6,150,821 A | 11/2000 | Mori et al. | 324/322 |
| 6,704,594 B1 | 3/2004 | Blank et al. | 600/423 |
| 7,859,260 B2 | 12/2010 | Reiderman | 324/303 |
| 8,154,286 B2 * | 4/2012 | Weinberg | 324/309 |
| 8,466,680 B2 * | 6/2013 | Weinberg et al. | 324/318 |
| 8,836,329 B2 * | 9/2014 | Weinberg | 324/307 |
| 2009/0149735 A1 | 6/2009 | Fallone et al. | 600/411 |

(Continued)

FOREIGN PATENT DOCUMENTS

| | | | |
|---|---|---|---|
| EP | 2294436 A1 * | 3/2011 | |
| JP | 2-46827 | 2/1990 | |
| WO | WO 2009155522 A1 * | 12/2009 | |

OTHER PUBLICATIONS

Notification Of Transmittal Of The International Search Report And The Written Opinion Of The International Searching Authority, Or The Declaration For PCT/US2009/047960, Filed Jun. 19, 2009.

(Continued)

*Primary Examiner* — Louis Arana
(74) *Attorney, Agent, or Firm* — Barnes & Thornburg LLP (57) ABSTRACT

An apparatus and a method for increasing the magnitude of the magnetic gradient for MRI without causing nerve stimulation. As an example, the short ramp time of magnetic gradients, for example less than 150 microseconds is contemplated. These short ramp-time magnetic gradients are used for the imaging of structures with short relaxations times, such as teeth, without causing nerve stimulation. The apparatus comprises a generator of magnetic gradients of at least 1 milliTeslas in magnitude with at least one gradient ramp time shorter than 150 microseconds and which induces no peripheral nerve stimulation.

9 Claims, 10 Drawing Sheets

(56) References Cited

U.S. PATENT DOCUMENTS

| | | | |
|---|---|---|---|
| 2009/0251141 A1 | 10/2009 | Baumgartl et al. | 324/307 |
| 2009/0315560 A1* | 12/2009 | Weinberg | 324/309 |
| 2010/0295641 A1 | 11/2010 | Schild et al. | 335/216 |
| 2011/0068791 A1* | 3/2011 | Weinberg | 324/309 |
| 2011/0089947 A1* | 4/2011 | Weinberg et al. | 324/309 |
| 2012/0223711 A1* | 9/2012 | Weinberg | 324/309 |

OTHER PUBLICATIONS

Supplementary European Search Report Application No. 09 76 7831, dated Jun. 9, 2011.

Conradi, "Generation of Short, Intense Gradient Pulses", Journal of Magnetic Resonance vol. 94, No. 2, (1991), pp. 370-375.

Mueller et al., "A High-Efficiency 4-Switch GOT Speed-Up Inverter for the Generation of Fast-Changing MRI Gradient Fields", pp. 806-812.

Zupanete et al., "Coils Producing a Magnetic Field Gradient for Diffusion Measurements With NMR", pp. 79-80.

Riepe, "High-Voltage Microsecond Pulse-Forming Network", pp. 1028-1030.

Bauer et al., "Innovative Efficient Gradient Coil Driver Toplogy," IEEE, (2004), pp. 1838-1843.

Sanders et al., "High Power Solid State Switch Module", IEEE, (2004), pp. 563-566.

Reichert et al., "Magnetic Resonance Imaging of Cortical Bone With Ultrashort TE Pulse Sequences", Magnetic Resonance Imaging, 23, (2005), pp. 611-618.

International Standard, "Particular Requirements for the Basic Safety and Essential Performance of Magnetic Resonance Equipment for Medical Diagnosis", (2010), p. 1-224.

ICNIRP Guidelines, "For Limiting Exposure to Time-Varying Electric, Magnetic and Electromagnetic Fields," Health Physics 74(4), pp. 493-523.

Reilly, "Maximum Pulsed Electromagnetic Field Limits Based on Peripheral Nerve Stimulation: Application to IEEE/ANSI C95.1 Electromagnetic Field Standards,"IEEE Transactions on Biomedical Engineering, vol. 45, No. 1, (1998), pp. 137-141.

Bertora et al., "Transversal Gradient Compensation in Three-Sided MRI Magnets," Robotics, Brain and Cognitive Sciences, Italian Institute of Technology, (2009) p. 3056.

Vogt et al., "Increased Time Rate of Change of Gradient Fields: Effect on Peripheral Nerve Stimulation at Clinical MR Imaging", Radiology, (2004), pp. 548-554.

Joachim et al., "Peripheral Nerve Stimulation by Time-Varying Magnetic Fields", Journal of Computer Assisted Tomography, vol. 21(4), (1997), pp. 532-538.

Glover, "Interaction of MRI Field Gradients With the Human Body", Phys. Med. Biol. vol. 54, (2009), pp. R99-R115.

Harvey et al., "Avoiding Peripheral Nerve Stimulation: Gradient Waveform Criteria for Optimum Resolution in Echo-Planar Imaging", MRM, (1994), pp. 236-241.

* cited by examiner

APPARATUS AND METHOD FOR DECREASING BIO-EFFECTS OF MAGNETIC GRADIENT FIELD GRADIENTS

CROSS-REFERENCE TO RELATED APPLICATION(S)

This is a continuation-in-part of prior U.S. application Ser. No. 12/488,105 filed Jun. 19, 2009. This application claims benefit of the filing date U.S. Provisional Patent Application No. 61/074,397, filed on Jun. 20, 2008, the contents of both applications are hereby incorporated herein by reference.

GOVERNMENT LICENSE RIGHTS

This invention was made with government support under grant number 5R42HL086294 awarded by National Institutes of Health. The U.S. Government has certain rights in the invention.

FIELD OF THE INVENTION

The present invention concerns an apparatus and a method for decreasing the bio-effects of magnetic field gradients on tissue(s). More specifically, the present invention concerns an apparatus and a method to decrease bio-effects on neurological tissue from magnetic field gradients, such as those experienced during Magnetic Resonance Imaging ("MRI"). The present invention concerns an apparatus and method capable of applying magnetic gradients for short durations, thereby allowing images of solid structures (for example, teeth or bones) to be more effectively described with MRI. The present invention provides the capability to attain higher magnetic gradient field strengths than were previously believed possible to apply without causing nerve stimulation.

DESCRIPTION OF RELATED ART

As should be appreciated by those skilled in the art, MRI is a technology whereby a magnetic field gradient is applied to subatomic particles in tissue to spatially encode a subsequent response from the atoms and molecules in the tissue to a radiofrequency pulse. After detection of an electromagnetic response from the tissue, an image of the tissue is generated partly based on that response.

Unfortunately, the generation of magnetic field gradients (e.g., switching gradients) may elicit undesirable responses in a living organism by induction of electrical pulses in nerves and other electrically-sensitive tissues.

The level of magnetic gradient change in time (dB/dt) required to elicit a nerve response is called the excitation threshold. The mathematical integral of dB/dt in time is delta-B, denoted in the literature as the excursion of magnetic flux density.

Scientific literature suggested that the excitation threshold for dB/dt nerve excitation thresholds converge to a minimal excursion (delta-B) of magnetic flux density, corresponding to an asymptotic physiological threshold for delta-B at short stimulation durations (see for example, the 1998 article by J P Reilly, entitled "Maximum pulsed electromagnetic field limits based on peripheral nerve stimulation: Application to IEEE/ANSI C95.1 electromagnetic field standards," published in the IEEE Transactions of Biomedical Engineering, Volume 45(1), pages 137-141).

Figure 1:
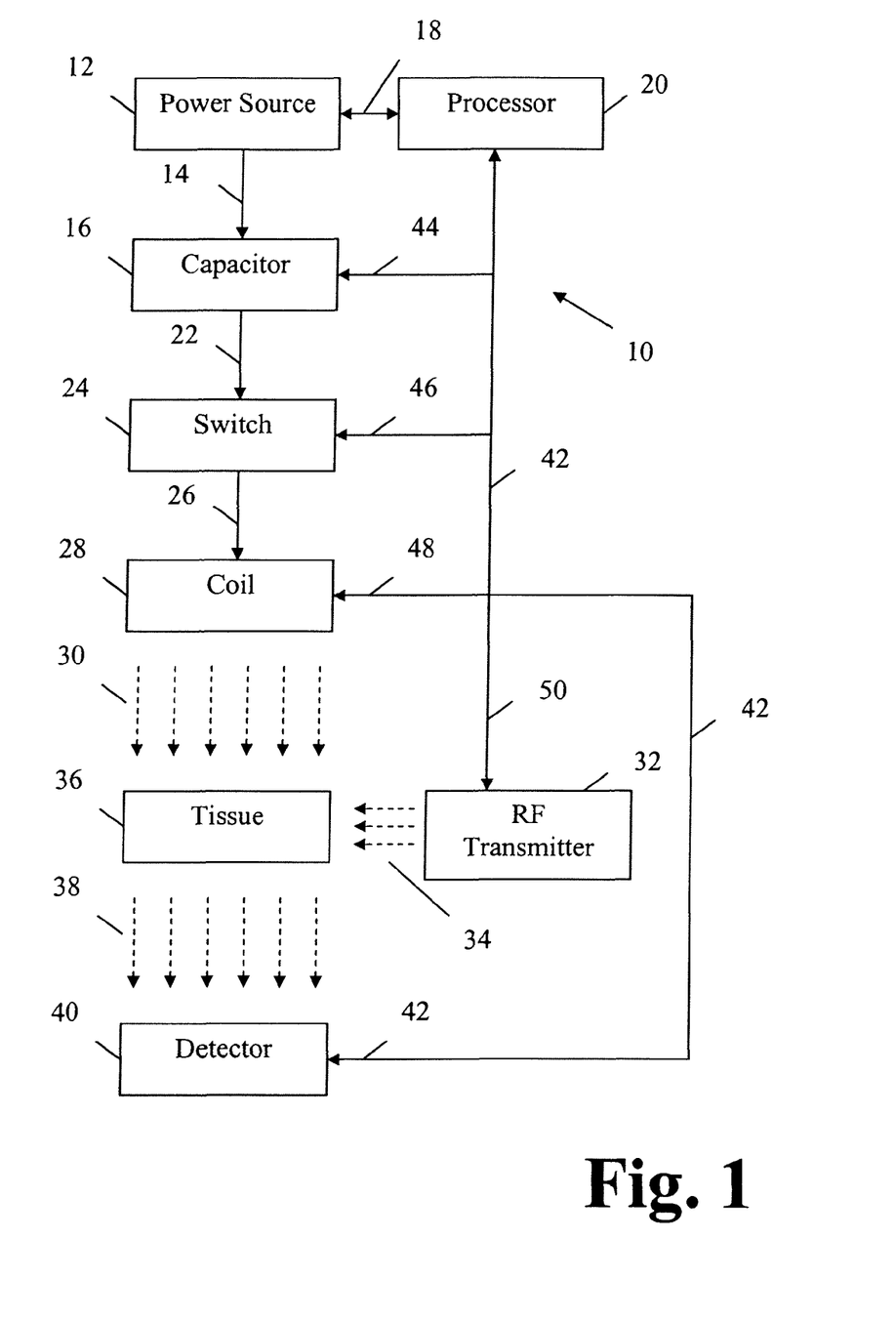
FIG. 1 is a schematic illustration of a first embodiment of an apparatus contemplated by the present invention.

In other words, it was believed that building an apparatus capable of reaching high magnetic gradients in very short ramp-times would not be worth building, since such an apparatus would cause discomfort to patients at ever lower gradient strengths (see FIG. 1). This expectation of an asymptotic threshold for delta-B has been codified in European Union regulations for human MRI systems (see, for example, the 1998 publication by the International Commission on Non-Ionizing Radiation Protection, entitled "Guidelines for limiting exposure to time-varying electric, magnetic, and electromagnetic fields (up to 300 GHz)," in the journal Health Physics, volume 74, pages 494-522, and the rule set out by the International Electrotechnical Commission in 2010, section 60601-2-33, relating to medical electrical equipment—Part 2-33: "Particular requirements for the basic safety and essential performance of magnetic resonance equipment for medical diagnosis").

In view of the foregoing, there exists a desire to apply higher magnetic field gradients to tissue in an MRI environment while avoiding adverse bio-effects on that tissue.

SUMMARY OF THE INVENTION

It is, therefore, one aspect of the present invention to provide an apparatus and a method for decreasing the duration of scan times for MRI.

An additional aspect of the present invention involves the application of magnetic field gradients with a magnitude greater than that traditionally employed. In one embodiment, the gradient may be up to five (5) times greater than previously applied. In other embodiments, the magnitude may be greater.

It is another aspect of the present invention to decrease bio-effects from magnetic field gradients by applying a magnetic field gradient to tissue within a time frame below the response threshold for that tissue.

Among other things, the current invention takes advantage of a physiological loophole: according to accepted physiological models for ionic channel transport, bi-phasic pulses on the order of a microsecond are too fast for the nerve to change its polarization state, and are, therefore, effectively ignored. The present invention capitalizes on this physiological loophole.

According to the model elaborated by Reilly, this loophole implies that gradient field thresholds may be increased by factors of five or more above the usual hyperbolic model without triggering any bio-effects.

The present invention also takes advantage of magnetic pulse delivery systems that are more powerful than traditional systems used to deliver MRI pulses.

In one contemplated embodiment, the present invention utilizes solid-state switch and/or PFL technologies that conform to the requirements of MRI gradient amplifiers. These requirements include increased repetition rates, impedance and trigger matching to MRI pulse programming consoles, and electrical/acoustic noise shielding considerations. Downstream modifications include the buttressing of gradient coils to handle the higher electromagnetic (i.e., J×B) forces that will occur at higher current loads, especially in high resolution MRI systems with high static magnetic fields.

According to classic coil-design codes, eddy current shielding is likely to be less of a problem than at current regimes, and reductions in inductance are predicted. The influence of eddy currents may further be minimized by acquiring signals at long echo time ("TE"), when eddy currents have died down, as contemplated by still another embodiment of the present invention.

In one further contemplated embodiment, the bore of the cryostat may be made significantly larger than the gradient coil, further reducing the influence of eddy currents.

A further aspect of the present invention is to provide an apparatus and a method for increasing the magnitude of the magnetic gradient for MRI without causing nerve stimulation.

An additional aspect of the present invention is the short ramp time of magnetic gradients, for example less than 150 microseconds.

An additional aspect of the present invention is the application of short ramp-time magnetic gradients to the imaging of structures with short relaxations times, such as teeth, without causing nerve stimulation.

Other advantages of the present invention will be made apparent from the discussion that follows and will be appreciated by those skilled in the art.

BRIEF DESCRIPTION OF THE DRAWINGS

The invention will now be described in connection with the drawings appended hereto, in which.

DESCRIPTION OF THE INVENTION

The present invention will now be described in connection with one or more embodiments. It is intended for the embodiments to be representative of the invention and not limiting of the scope of the invention. The invention is intended to encompass equivalents and variations, as should be appreciated by those skilled in the art.

As a prelude to the discussion of the various embodiments of the present invention, a general discussion of MRI devices is now provided. This overview is not intended to be limiting of the invention. It is provided merely to assist with an understanding of the components of the various embodiment of the present invention, as detailed below.

As a general rule, an MRI device includes a magnetic field generator, typically a magnetic coil and a radio frequency ("RF") generator or transmitter. The magnetic coil generates a time-varying magnetic field and the RF generator emits radio waves. The MRI device typically also applies a static magnetic field.

As should be appreciated by those skilled in the art, tissue is primarily composed of water molecules, each of which contains hydrogen atoms. When a person's tissue is exposed to a strong magnetic field, the hydrogen atoms align with the direction of the magnetic field. Subsequently, the RF generator emits radio waves to the hydrogen atoms while in the aligned state. Some of the energy from the radio waves is absorbed by the hydrogen atoms in the water molecules, thereby altering the magnetic alignment of the hydrogen atoms. The altered magnetic state is detected by the detector, which generates signals that are processed to form as an image.

With this overview in mind, reference is now made to FIG. 1. FIG. 1 provides a schematic diagram of a first contemplated embodiment of a MRI device 10 according to the present invention.

The MRI device 10 includes a power source 12. The power source 12 may be any type of generator suitable for generating power to be provided to the one or more of the components connected thereto. The generator may provide an alternating current (AC) or a direct current (DC), as should be appreciated by those skilled in the art. The precise output of the power source 10 is not critical to the operation of the present invention. Moreover, the power output, once generated, may be converted different types (e.g., AC or DC) as required by individual components of the system.

In FIG. 1, the power source 12 is illustrated as providing power to each of the various components of the MRI device 10 of the present invention. It is noted, however, that the depicted arrangement is meant to be illustrative only. As should be appreciated by those skilled in the art, the individual components of the MRI device 10 may receive power from a centralized source, such as the power source 12. Alternatively, the various components may receive power from alternative power sources. Accordingly, the depiction of a single power source 12 is not intended to be limiting of the invention.

In addition, as detailed below, the MRI device 10 of the present invention is illustrated and discussed with reference to single communication lines (or links) extending between the various components. The illustration of single communication lines is meant to simplify the discussion and illustration of the various embodiments of the invention. As should be appreciated by those skilled in the art, there may be multiple communication lines between the various components of the MRI device 10 as required for their operation. Moreover, the communication lines are not intended to be limited to wired links. To the contrary, the communication lines may be wireless, as required or desired for operation of the MRI device 10.

In one contemplated embodiment of the present invention, the power source 12 may include a plurality of power sources 12, each of which generates power with different characteristics, as required by the device(s) and/or components associated therewith.

As depicted in FIG. 1, power from the power source 12 travels in two directions. Power from the power source 12 is conducted first along a communication line 14 to a capacitor 16. Power from the power source 12 is carried second along a communication line 18 to a processor 20.

The capacitor 16 may be of any size or type as would be appreciated by those skilled in the art. As is its nature, the capacitor 16 stores a charge based on the power inputted from the power source 12. That charge is eventually discharged, as discussed in greater detail below.

While FIG. 1 illustrates a single capacitor 16, a plurality of capacitors 16 may be employed without departing from the scope of the present invention. In one contemplated embodiment, the MRI device 10 relies upon a plurality of capacitors 16 for its operation. As should be appreciated by those skilled in the art, plural sets of capacitors 16 may be employed to generate successive magnetic field gradients.

In the second flow path, power from the power source 12 is provided to the processor 20. The processor 20 may be of any type suitable for executing instructions, generating data, receiving data, storing data, and the like. In one contemplated embodiment, the processor 12 may be a personal computer. In other embodiments, the processor 12 may be a mainframe computer, a portable computer, a personal data assistant ("PDA") or any other similar device. The exact design and functionality of the processor 12 is not critical to operation of the present invention. Accordingly, the processor 12 may be of any type suitable for the operation of the MRI device 10.

The capacitor 16 is connected, via a communication line 22, to a switch, where the term switch refers to one or more high-power solid-state switch modules as described above. Accordingly, when the capacitor 16 discharges the stored charge, the stored charge passes through the communication line 22 to the switch 24.

The switch 24 is connected, via a communication line 26, to a coil 28. Accordingly, when the capacitor 16 is discharged, energy from the capacitor 16 is passed to the coil 28, which generates a magnetic field 30.

The coil 28 need not be a single coil. To the contrary, it is contemplated that the coil 28 may include a plurality of coils 28, each of which is capable of generating all or part of the magnetic field 30. Moreover, as should be appreciated by those skilled in the art, where plural coils 28 are employed, the coils 28 need not be of the same type or size. To the contrary, it is contemplated that, where plural coils 28 are employed, they may be differ from one another to produce magnetic field gradients of differing magnitudes, periods, etc.

As also shown in FIG. 1, the MRI device 10 includes an RF transmitter 32. As discussed briefly above, the RF transmitter 32 generates radio waves 34. While one RF transmitter 32 is illustrated, it is contemplated that a plurality of RF transmitters 32 may be employed without departing from the scope of the present invention. Moreover, where plural RF transmitters 32 are employed, they may be of different sizes, types, etc.

As illustrated, the magnetic field 30 and the RF waves 34 are directed at a tissue sample 36. While the tissue sample 36 may be a portion of an organism, it may also be a complete organism.

After interaction of the magnetic field 30 and the RF waves 34 with the tissue 36, the tissue 36 generates a responsive signal 38 that is detected by the detector 40. As should be appreciated by those skilled in the art, the signal 38 may encompass a multitude of different signals from the tissue 36. The detector 40 detects the signals 38 and passes the signals 38 to the processor 20 via the communication line 42. The processor 20 receives and processes the signals 38 to generate an image representative of the composition of the tissue 36.

As should be appreciated by those skilled in the art, the processor 20 may not be the device that processes the signals 38 to generate the image of the tissue 36. To the contrary, the detector 40 may be combined with a suitable imaging device. In still another embodiment, the imager may be a component separate from the processor 20 and the detector 40. Still further embodiments are contemplated to fall within the scope of the present invention.

With continued reference to FIG. 1, the MRI device 10 includes communication line 42. Communication line 42 is illustrated as a central bus that connects the processor 20 to the capacitor via communication line 44, to the switch, via communication line 46, to the coil, via communication line 48, and to the RF transmitter, via communication line 50. A central bus, however, is not required to practice the invention. To the contrary, multiple connections may be established between the components of the MRI device 10 without departing from the scope of the invention, as discussed above.

It is noted that the communication lines 14, 18, 22, 26, 42, 44, 46, 48, 50 all may conduct data and/or power. The communication lines, therefore, are meant to illustrate multi-modal connections between the various components of the MRI device 10. As noted above, each of the communication lines 14, 18, 22, 26, 42, 44, 46, 48, 50 may be replaced with one or more separate connections, as required or desired. The communication lines 14, 18, 22, 26, 42, 44, 46, 48, 50 may be unidirectional or bidirectional as required or desired.

With respect to the communication lines 42, 44, 46, 38, 50, it is contemplated that the processor 20 will provide operating instructions to one or more of the components to which it is connected. The processor 20, therefore, is contemplated to incorporate control functionality over one or more of the components, as should be appreciated by those skilled in the art. It is also contemplated that controls may be fed from one component to another, as required or desired for operation of the MRI device 10.

Figure 2:
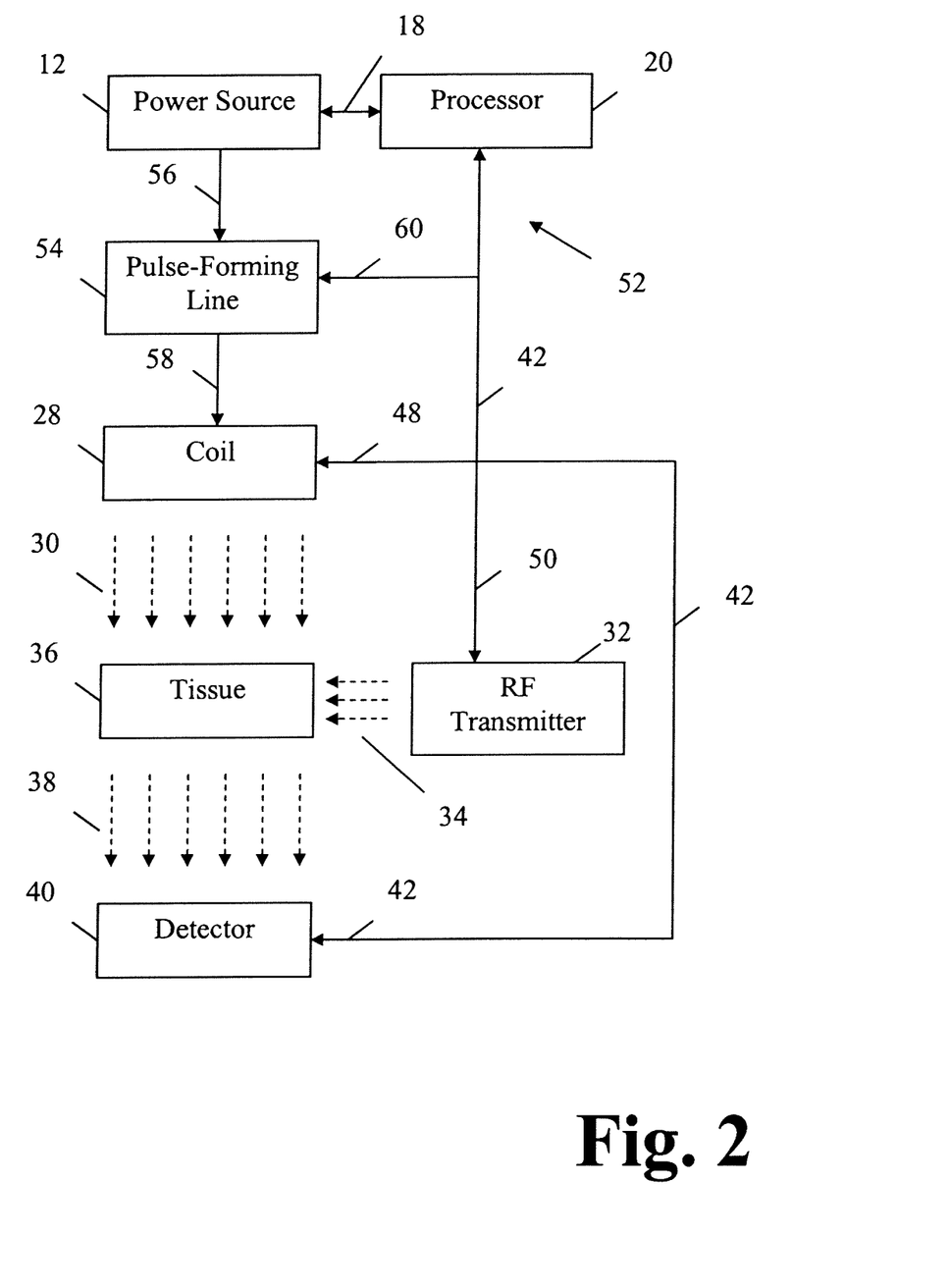
FIG. 2 is a schematic illustration of a second embodiment of an apparatus contemplated by the present invention.

FIG. 2 illustrates an MRI device 52, which is a second embodiment contemplated by the present invention. Many of the components of the MRI device 52 are the same as illustrated and described in connection with MRI device 10 in FIG. 1. As a result, those components are provided with the same reference numbers as the components in FIG. 1. Moreover, the descriptions of these components is not repeated for the sake of brevity.

The MRI device in FIG. 2 differs from the MRI device 10 in FIG. 1 in at least one respect. Specifically, the capacitor 16 and the switch 24 have been replaced with a pulse-forming line 54. As should be appreciated by those skilled in the art, the pulse-forming line 54 may include one or more capacitors and switches. The pulse forming line 54 is connected to the power source 12 via communication line 56. The pulse forming line 54 is connected to the coil 28 via the communication line 58. The pulse forming line 54 connects to the processor via the communication line 60.

As discussed above, a pulse forming line 54 is also known as a Blumlein line. Pulse forming lines 54 are transmission lines that begin draining their charge in response to a triggering event, such as when triggered by a solid-state switch. Pulse forming lines 54 also are referred to as pulse forming networks. A pulse forming network ("PFN") accumulates electrical energy over a predetermined period of time and releases the electrical energy in the form of a square pulse in a relatively short period of time, depending upon the materials that make up the PFN 54. PFNs 54 also may be engineered to provide pulsed power. A PFN 54 may be charged by a high voltage power source 12 and then rapidly discharged (possibly via a high voltage switch).

The pulse forming line 54 may be a single line or may be a plurality of lines combined together. The pulse forming line 54 also may be a pulse forming network 54, as discussed above. The exact composition and construction of the PFN 54 is not critical to operation of the present invention.

Figure 3:
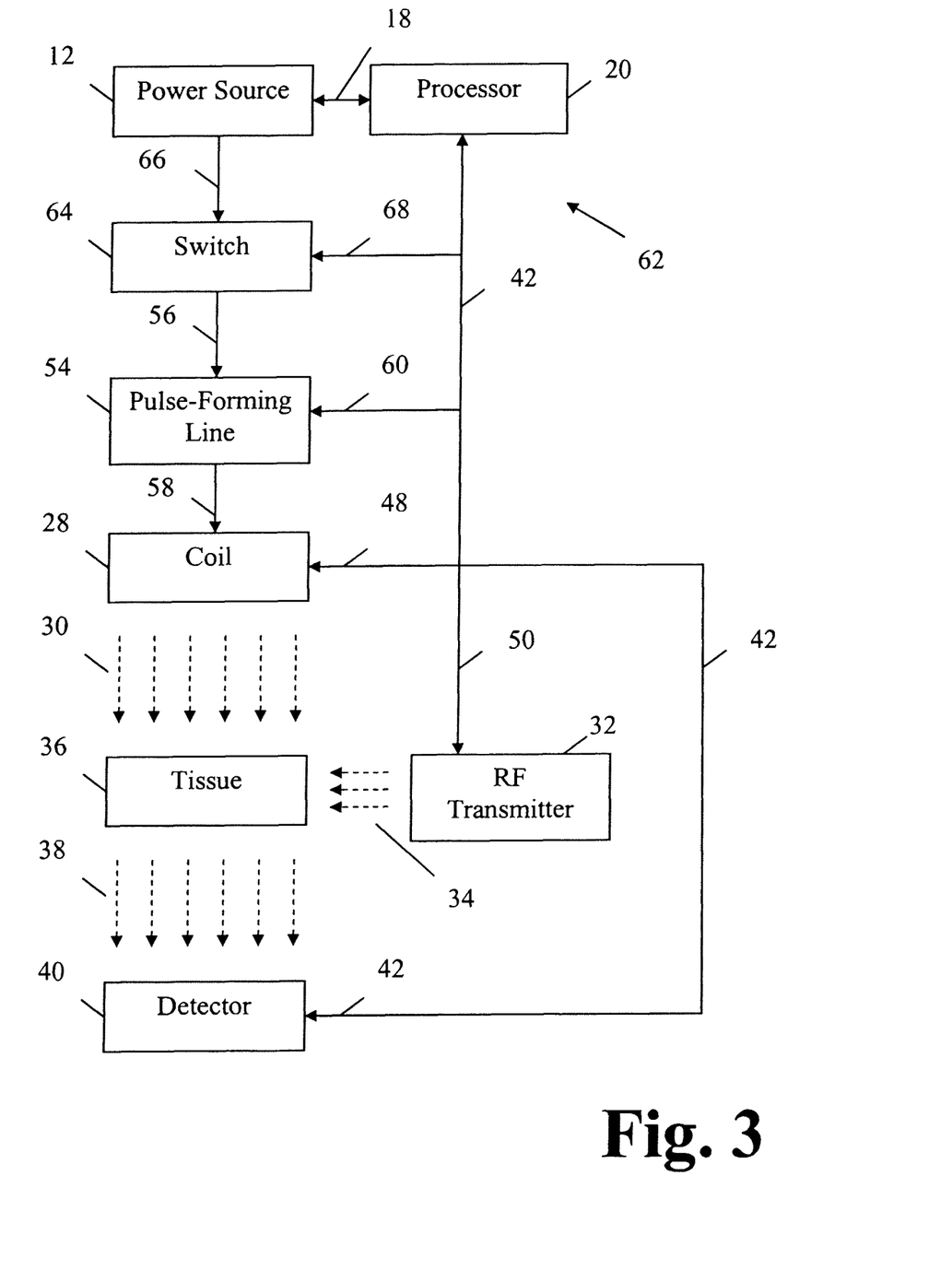
FIG. 3 is a schematic illustration of a third embodiment of an apparatus contemplated by the present invention.

FIG. 3 illustrates a third embodiment of an MRI device 62. This embodiment is similar to the MRI device 52 illustrated in FIG. 2. In this third embodiment, however, a switch 64 has been added between the power source 12 and the pulse forming line 54. As illustrated, the power source is connected to the switch via a communication line 66. The switch 65, in turn, is connected to the processor 20 via the communication line 68. As noted above, the switch 65 may be employed to trigger the pulse forming line 54 to release its energy to the coil 28.

Figure 4:
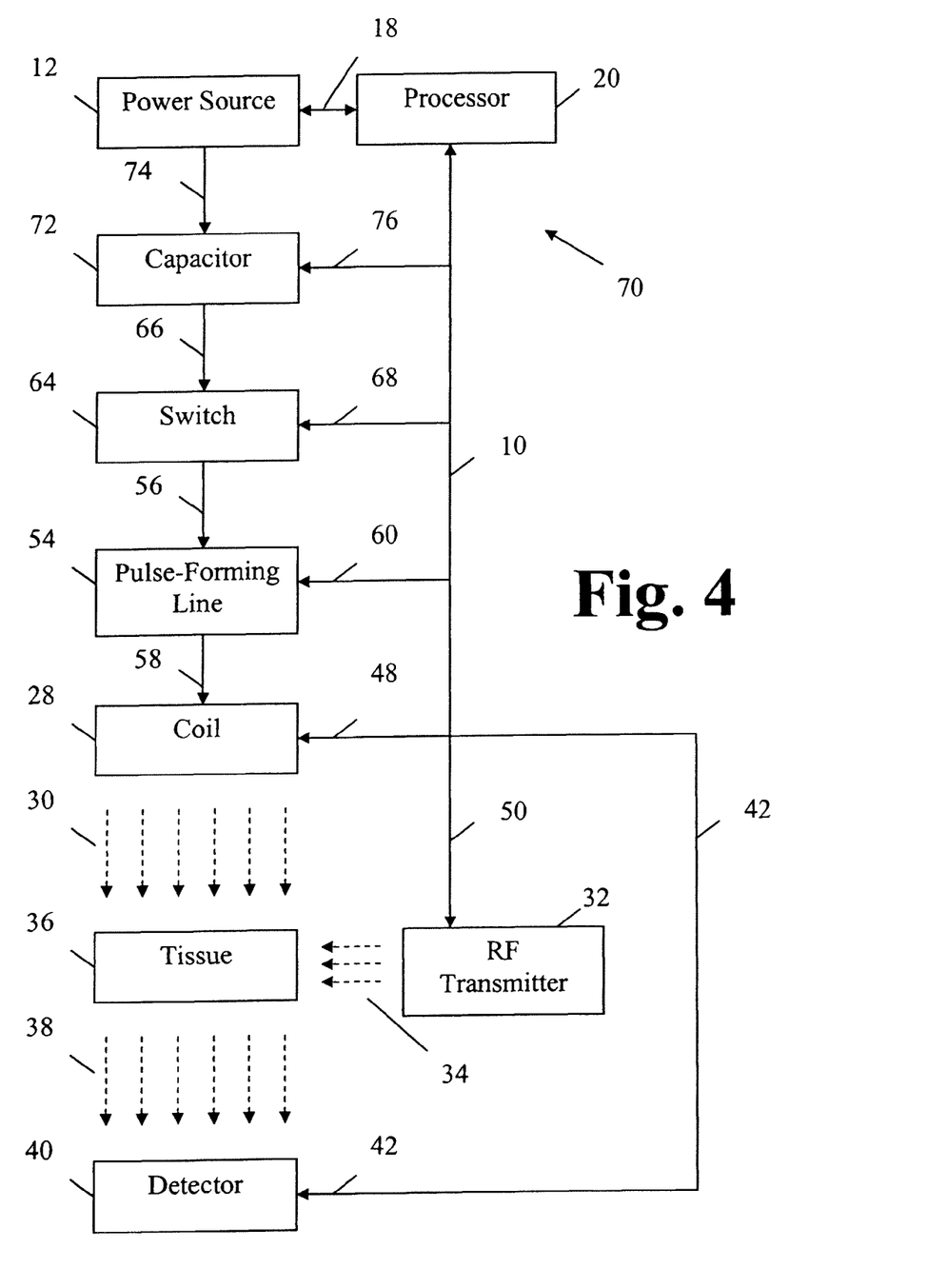
FIG. 4 is a schematic illustration of a fourth embodiment of an apparatus contemplated by the present invention.

FIG. 4 illustrates a fourth embodiment of an MRI device 70. This fourth embodiment is a modification of the MRI device 62, which is illustrated in FIG. 3. Here, a capacitor 72 has been inserted between the switch 64 and the power source 12. The capacitor 72 connects to the power source via the communication line 74. The capacitor 72 connects to the processor via the communication line 76. In this embodiment, it is contemplated that the capacitor 72 will discharge power to the switch 64, which will discharge power through the pulse forming line 54 to the coil 28, as illustrated.

With respect to the embodiments illustrated in FIGS. 1, 2, 3, and 4, and for purposes of the present invention, the connection between the power source 12 and the coil 28 is considered to be a controlled communication line. As a result, the embodiments provide variations for contemplated constructions of that controlled communication line.

Figure 5:
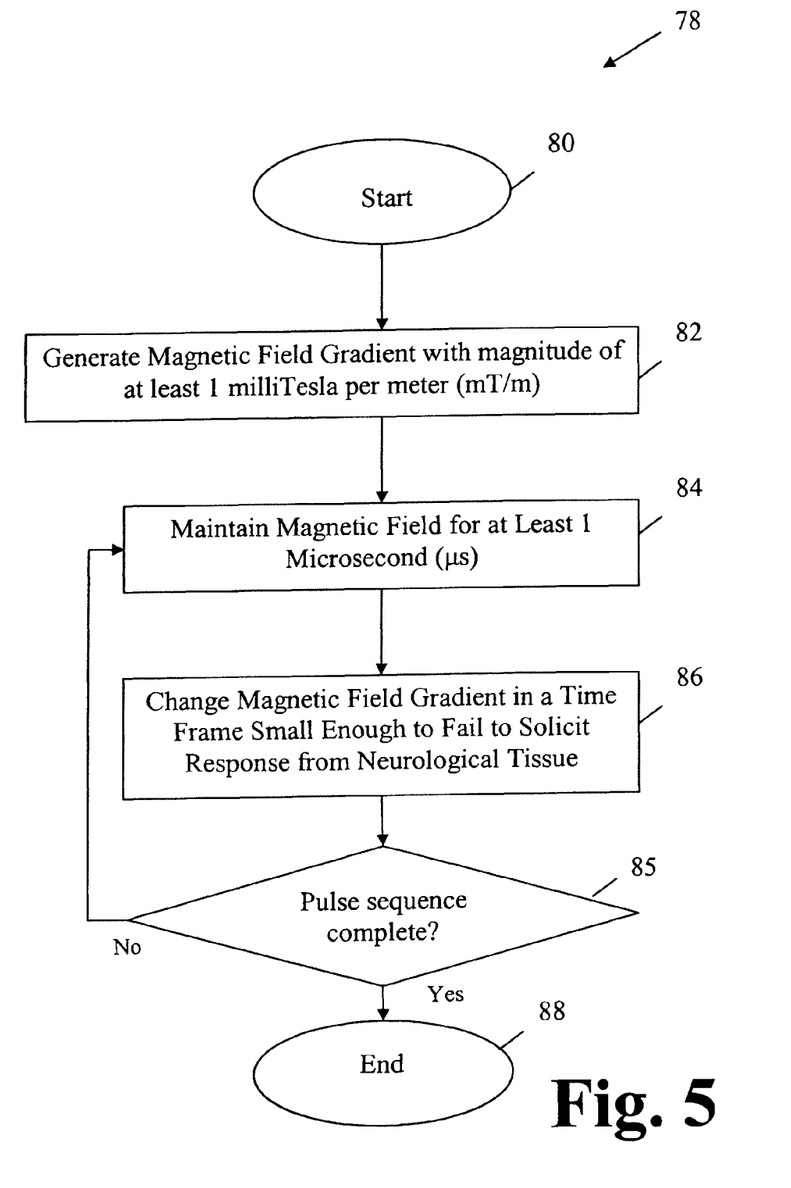
FIG. 5 is a flow chart illustrating one method contemplated by the present invention.

FIG. 5 illustrates a method 78 contemplated by the present invention. The method 78 starts at 80 and ends at 88. Following the start 80, at 82, a magnetic field gradient with a minimum amplitude of 1 milliTesla per meter (mT/m) is generated. At 84, the magnetic field gradient is maintained for a least about 1 microsecond and up to about 10 milliseconds (this is the plateau time period, as discussed below). At 86, the magnetic field gradient is changed in a time frame small enough to fail to solicit a response from neurological tissue. A decision point 85 follows the operation identified at 86. As the flow chart in FIG. 5 indicates, via the decision point 85, steps 84 and 86 are repeated as necessary to obtain physiological and/or anatomic information about tissues. If the pulse sequence is sufficient to obtain the necessary physiological and/or anatomic information about tissues, then the method 78 ends at 88.

As discussed in greater detail below, it is contemplated that application of the magnetic field gradient with rise- and fall-times of less than about 10 microseconds will establish suitable conditions to avoid triggering a biological response from neurological tissue. As should be appreciated by those skilled in the art, and as discussed in greater detail below, the present invention permits the application of a magnetic field gradient higher than that permitted using existing technology, because the present invention relies, at least in part on shorter rise- and fall-times than available in the prior art.

Figure 6:
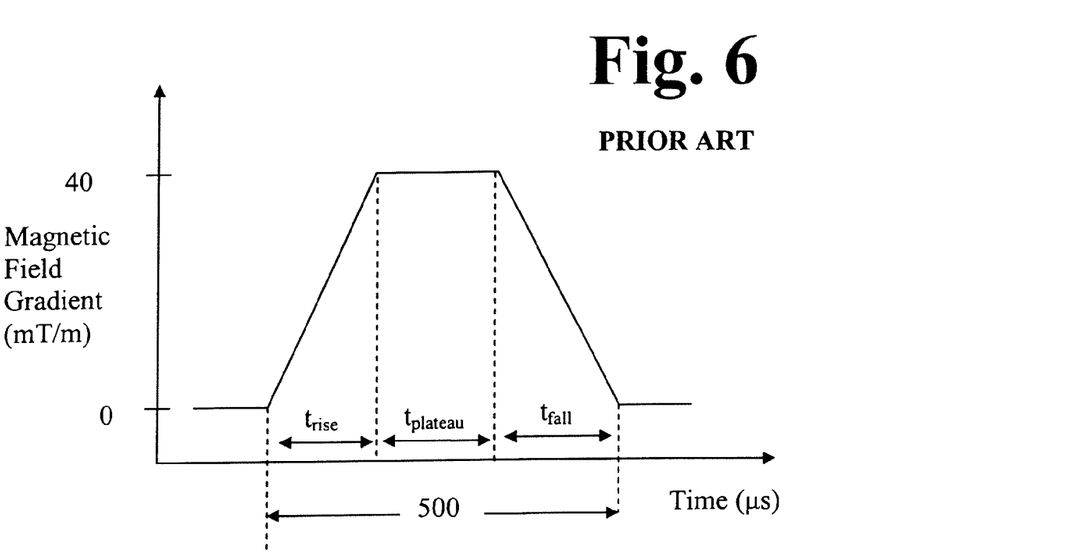
FIG. 6 is a graph depicting the magnetic field gradient and duration typical of a prior art MRI device as used clinically.

FIG. 6 is a graphical illustration of a single magnetic field gradient pulse according to the prior art. The rise-time $t_{rise}$ (approximately 150 microseconds) and fall-time $t_{fall}$ (approximately 150 microseconds) of the magnetic field gradient pulse exceed a neurological response time $t_{response}$ for neurological tissue at a typical magnetic field slew rate $S_{typical}$. For a typical clinical system, $S_{typical}$ is 400 T/m/s. Data acquisition is typically performed during the plateau phase, because of difficulties in deconvolving the effects of the changing gradient field. As a result, the most useful portion of the pulse is the plateau time, $t_{plateau}$. The pulse duration includes both the rise and fall times as well as the plateau time, for a typical total duration of 500 microseconds. It should, therefore, be apparent that shortening the rise and fall times can reduce overall scan time.

As should be appreciated by those skilled in the art, the terms "rise" and "fall" may be applied to both negative- and positive-generated pulses.

Figure 7:
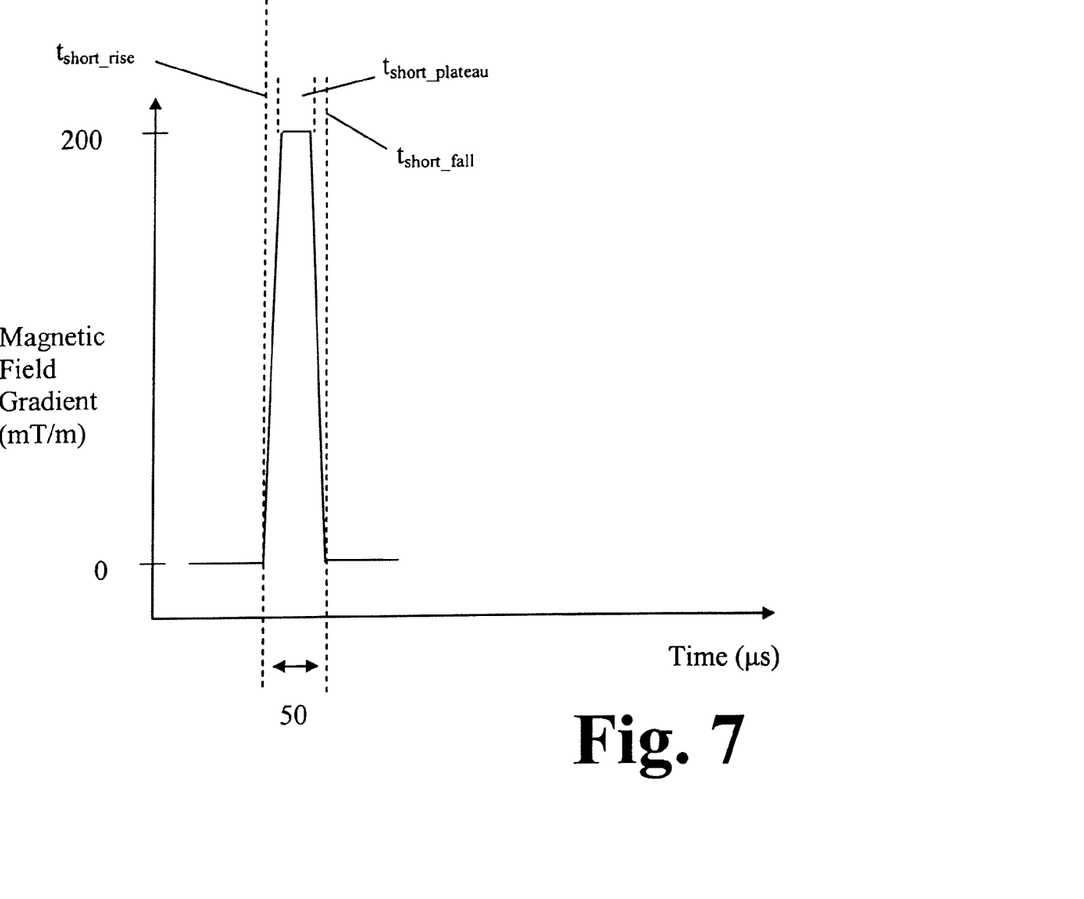
FIG. 7 is a graph depicting the magnetic field gradient and duration contemplated by the present invention.
Figure 8:
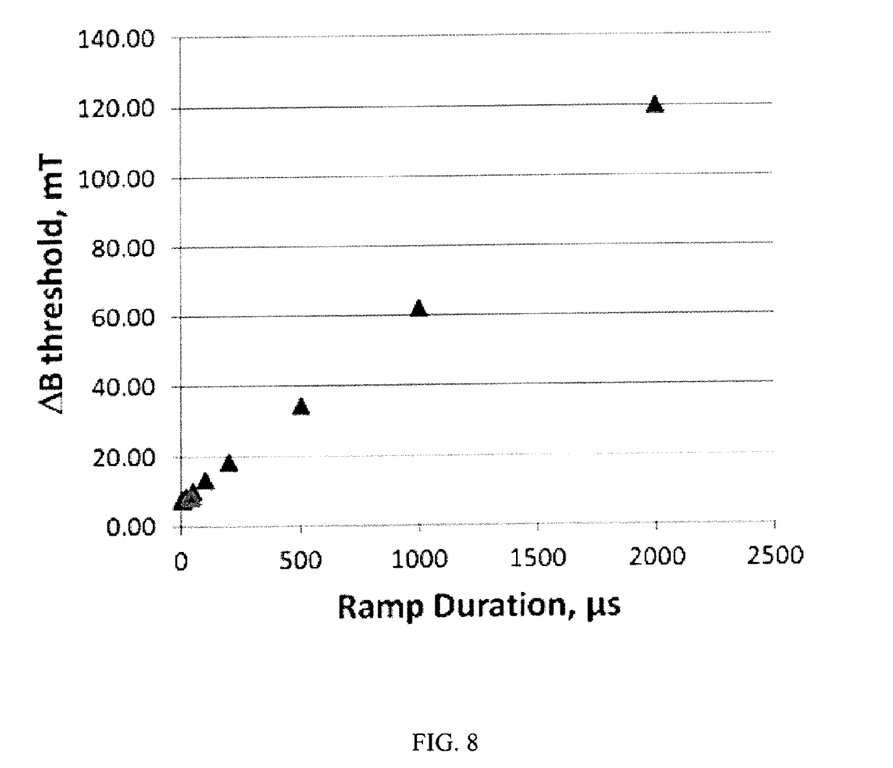
FIG. 8 is a graph demonstrating a summary of prior experiments concerning the relationship between gradient ramp time and the threshold delta-B gradient flux density for nerve stimulation.

FIG. 7 provides a graphical illustration of a magnetic field gradient pulse generated according to the present invention. The shortened pulse rise-time duration $t_{short\_rise}$ is less than the rise-time $t_{rise}$ according the practice in the prior art. The current invention typically would employ a $t_{short\_rise}$ of 10 microseconds or less. The shortened pulse fall-time duration $t_{short\_fall}$ is less than the fall-time $t_{fall}$ according the practice in the prior art. The current invention typically would employ a $t_{short\_fall}$ of 10 microseconds or less. Also, the pulse ramp times $t_{short\_rise}$ and $t_{short\_fall}$ are less than the neurological response time $t_{response}$ for neurological tissue at a typical magnetic field slew rate $S_{typical}$. The slew rate in the present invention is increased as a result of the reduced pulse ramp times. In the present invention, the plateau magnitude is increased, as compared to the prior art, because of several factors. Firstly, the plateau magnitude may be increased because of the improved switching techniques as described above. Secondly, the plateau magnitude may be increased because the tissues are depolarized and repolarized within a short period of time similar to to the neurological response time $t_{response}$, in a multi-phasic train of pulses as prescribed by the model according to Reilly.

As should be apparent, the short duration of the time periods $t_{short\_rise}$ and $t_{short\_fall}$ make possible the application of a large magnitude magnetic pulse without soliciting a biological response from neurological tissue. As discussed above, it is the change in the magnetic field that elicits a biological response. With a rapid change in magnetic field strength, the effects on the biological tissue may be minimized such that there is little or no biological response from the tissue.

It is contemplated that the magnitude of the pulse during the time period $t_{plateau}$ may be any value. As discussed above, the magnitude may be as small as 1 mT/m. It is contemplated that the magnitude may be smaller or greater than 1 mT/m, as required or desired for a particular application. While the magnitude of the magnetic field is theoretically unbounded at its upper limit, it is foreseeable that the magnitude may be 10,000 mT/m or less.

As for the duration of the time periods $t_{short\_rise}$ and $t_{short\_fall}$, it is contemplated that these time periods will fall in a range between about 1 and about 10 microseconds. As noted above, 10 microseconds is a sufficiently short time period in which to change a magnetic field so that tissue does not react biologically. Naturally, the shorter the duration of $t_{short\_rise}$ and $t_{short\_fall}$, the smaller the likelihood of eliciting a biological response. In keeping with this premise, it is contemplated that the invention will operate with one or both of the time periods, $t_{short\_rise}$ and $t_{short\_fall}$, being less than about 9 microseconds. In another contemplated embodiment, one or both of the time periods is less than about 8 microseconds. In still another contemplated embodiment, one or both of the time periods is less than about 7 microseconds. Further, the time periods are less than about 6 microseconds in another contemplated embodiment. In one other contemplated embodiment, one or both of the time periods is less than about 5 microseconds. One or both of the time periods may be less than about 4 microseconds in yet another contemplated embodiment. Still further, it is contemplated that one or both of the time periods is less about than 3 microseconds. In an additional contemplated embodiment, one or both time periods is less than about 2 microseconds. In one further contemplated embodiment, one or both of the time periods is less than about 1 microsecond. As should be apparent, the time periods, $t_{short\_rise}$ and $t_{short\_fall}$, need not be identical in duration. The variable $t_{short\_rise}$ may be greater than, equal to, or less than the variable $t_{short\_fall}$ without departing from the scope of the present invention.

In the present invention, the shortening of overall scan times is effected through at least mechanisms in the present invention: Firstly, the reduced rise- and fall-times lead to an overall reduction in scan time. Secondly, the higher plateau magnitude allows the MRI system to acquire data of quality comparable to the prior art using a shorter plateau time $t_{short\_plateau}$.

A comparison between FIGS. 6 and 7 also illustrate one further aspect of the present invention. Specifically, the magnetic field gradient as generated by the prior art is about 5 times weaker than the magnetic field gradient generated by the MRI device 10 of the present invention.

In summary, the invention consists of an apparatus to deliver very short multi-phasic magnetic gradient pulses for magnetic resonance imaging. The invention also includes the method of decreasing bio-effects in magnetic resonance imaging through the use of reduced pulse lengths and multi-phasic magnetic gradient pulses.

As discussed, the magnetic pulses are created by releasing electrical charge stored in capacitors and/or transmission lines into coils and/or transmission lines near a body part. The coils may include dielectric and/or ferrite materials which assist in the shaping of the magnetic pulses. Ferrite materials may be used to construct complex dynamic electromagnetic fields for circulators and other circuit elements employed in microwave transmission and receivers (as disclosed by Ansoft Corporation, in Microwave Journal, June, 1996).

Among other differences, the invention differs from the prior art by prescribing multi-phasic pulse trains within a short period of time similar to the neurological response time $t_{response}$, unlike the pulse sequences previously taught.

Figure 9:
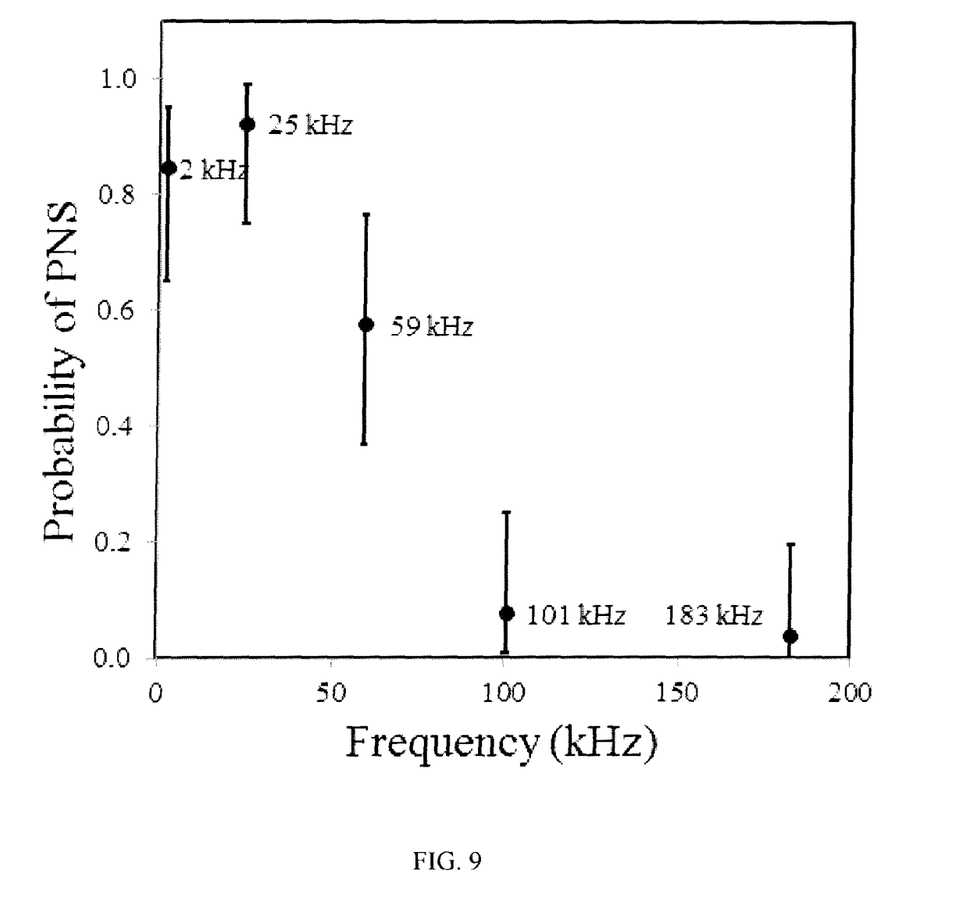
FIG. 9 is a graph demonstrating an experiment of an apparatus constructed according to the present invention, in which the probability of peripheral nerve stimulation (PNS) is shown to decrease as the ramp time decreases (i.e., with increasing magnetic gradient frequency)

Turning to the embodiment of FIGS. 8-11, an apparatus built to test the physiological principles underpinning the present invention has shown that the asymptotic assumption about magnetic flux excursion (predicted by FIG. 8) is not correct. FIG. 9 shows that for a given magnetic flux threshold (400 milliTesla), the probability of nerve stimulation is dramatically reduced at ramp times below 10 microseconds (i.e., at frequencies above 100 kHz). This physiological behavior is reflected in a claim that gradient magnetic flux can be increased above 100 milliTesla without causing nerve stimulation. Typical MRI systems for human use attain maximal flux density of 40 milliTeslas.

One advantage of very short ramp times and very high gradient magnetic flux excursions is that a pulse train of such short high pulses will have a shorter overall duration than a pulse train with a similar number of longer pulses.

Short pulse trains would be particularly beneficial when imaging solid structures such as teeth or bones with MRI. Solid structures have low spin-spin relaxation time (denoted as T2), and so short pulse sequences allow image data to be collected in the short time before the spins in the solid lose their polarization.

As a prelude to the discussion of the various embodiments of the present invention, a general discussion of MRI devices is now provided. This overview is not intended to be limiting of the invention. It is provided merely to assist with an understanding of the components of the various embodiment of the present invention, as detailed below.

As a general rule, an MRI device includes a magnetic field generator, typically a magnetic coil and a radio frequency ("RF") generator or transmitter. The magnetic coil generates a time-varying magnetic field and the RF generator emits radio waves. The MRI device typically also applies a static magnetic field.

As should be appreciated by those skilled in the art, tissue is primarily composed of water molecules, each of which contains hydrogen atoms. When a person's tissue is exposed to a strong magnetic field, the hydrogen atoms align with the direction of the magnetic field. Subsequently, the RF generator emits radio waves to the hydrogen atoms while in the aligned state. Some of the energy from the radio waves is absorbed by the hydrogen atoms in the water molecules, thereby altering the magnetic alignment of the hydrogen atoms. The altered magnetic state is detected by the detector, which generates signals that are processed to form as an image.

Figure 10:
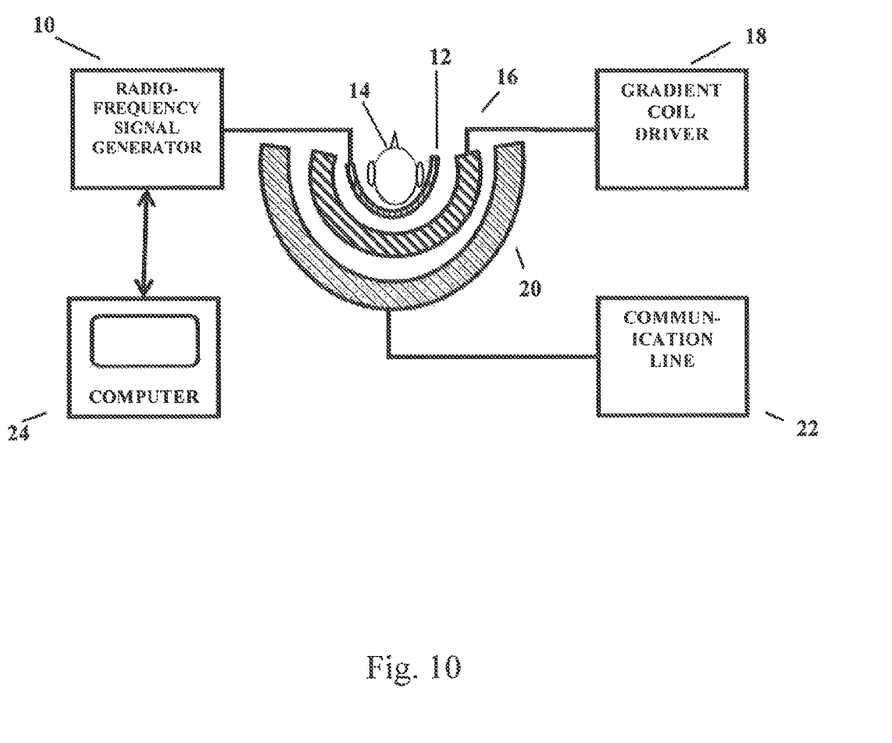
FIG. 10 is a schematic illustration of an MRI system, to which the present invention could apply.
Figure 11:
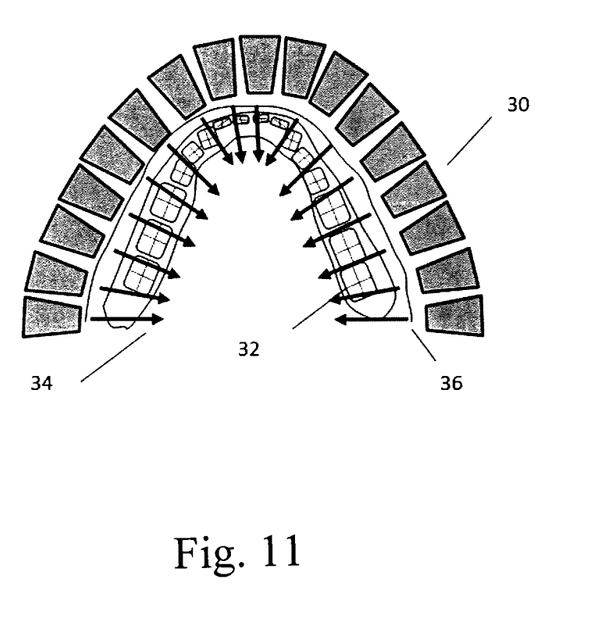
FIG. 11 is a schematic illustration of an embodiment of an apparatus contemplated by the present invention, directed at imaging the teeth.

FIG. 10 demonstrates a block diagram to aid in illustrating a typical MRI system, whose form although included as a reference is not intended to limit the scope of the present invention. For example, in most pre-clinical and clinical MRI systems, the coils entirely circle the body part of interest. The MRI system shown in FIG. 3 represents an MRI system which does not completely encircle the body. As presented in 2010 by F. Bertora, A. Borceto, and A. Viale, at the 18$^{th}$ Annual Meeting of the International Society for Magnetic Resonance in Medicine, in an abstract entitled "Transversal Gradient Compensation in Three-Sided Magnets" (page 4876), it is possible to construct coils that do not entirely encircle the object of interest and yet can create magnetic fields adequate for collecting images, e.g., homogeneous magnetic fields.

In FIG. 10, a radio-frequency signal generator (10) sends an electrical pulse to one or more portions of a radio-frequency coil (12) which is in proximity to a body part of interest (14). A coil (16), whether planar or annular, capable of creating a magnetic gradient is activated by a gradient coil driver (18). The gradient coil (16) may be combined with, or in close proximity to, the radio-frequency coil (12). A static coil (18) is controlled by a driver (20). The static coil (18) may include parts of the so-called gradient coil (16), and vice versa. For example, the so-called gradient coil (16) may include sections which provide a uniform magnetic field for a period of time, which is long enough to polarize spins sufficiently to be read out by short gradient pulses created by sections of the so-called gradient coil (16). Signals from species with spins in the body part (14), said species including electrons and/or protons, that are collected by one or more portions of the radio-frequency coil (12) or some other sensor of magnetic fields (e.g., a magnetometer) are converted into digital signals and analyzed by a computer (24) and displayed to a viewer.

An example of an experimental MRI system that utilized gradient pulses with short durations is given in the 2005 publication by I. L. H. Reichert, M. D. Robson, P. D. Gatehouse, T. He, K. E. Chappell, J. Holmes, S. Girgis, and G. M. Bydder, entitled "Magnetic resonance imaging of cortical bone with ultrashort TE pulse sequences", in the journal Magnetic Resonance Imaging, Vol. 23, pages 611-618. In that publication, the authors noted that it would be difficult to implement their preferred pulse sequences on a conventional clinical MRI system. The present invention, which shows how to reduce nerve stimulation in the presence of ultrashort pulse sequences, facilitates implementation of ultrashort pulse sequences in an MRI system. Ultra short pulse sequences would be particularly useful when examining materials with short decay times, e.g., bones, teeth or when using electron spin resonance.

An MRI system with ultra-short gradients as in the present invention, capable of imaging bones and teeth, could be built in a compact way using planar or quasi-planar coils that did not wrap around the entire body. As an example, as in FIG. 11, electromagnetic coils (30) could be placed near the teeth (32), for example in an approximately semi-circular pattern, possibly with a radio-frequency antenna (36), in which the coils (30) created quasi-static and/or gradient magnetic fields (34) in order to yield a compact apparatus suitable for dental imaging.

In summary, the invention consists of an apparatus that delivers magnetic gradient pulses with short ramp-times for magnetic resonance imaging, with reduced incidence of nerve stimulation. The invention also includes a means of increasing gradient strength through the application of short gradient ramp-times. The invention also includes the imaging of solid structures such as teeth with short pulses and reduced nerve stimulation.

Other aspects of the present invention should be apparent to those skilled in the art based on the discussion provided herein.

What is claimed is:

1. A magnetic imaging apparatus comprising:
a power source; and
at least one coil,
wherein the power source and coil cooperate to generate magnetic field gradients having a magnitude of greater than 100 milliTesla, the magnitude and a ramp time in which the magnetic field gradients rise to or fall from this magnitude are selected to elicit no neurological response when generated in the presence of a structure and neurological tissue, and
wherein the selected ramp time is less than 10 microseconds.

2. The apparatus according to claim 1, further comprising an energy store and a switch, wherein energy provided by the power source is stored within the energy store and thereafter selectively delivered through the switch to the coil to generate the magnetic field gradients.

3. The apparatus according to claim 2, wherein the coil is adapted to generate a time-varying magnetic field.

4. The apparatus according to claim 1, wherein the selected magnitude comprises at least 1 milliTesla per meter.

5. The apparatus according to claim 1, wherein the selected ramp time comprises a ramp time within a range of 1 microsecond to about 10 microseconds.

6. The apparatus according to claim 1, wherein the structure comprises a tooth.

7. The apparatus according to claim 1, wherein the structure comprises cortical bone.

8. A method of magnetic imaging of a structure, comprising:
generating a magnetic field gradient using a power source and at least one coil, wherein the magnetic field gradient has a magnitude of greater than 100 milliTesla and a ramp time for the magnetic field gradient to rise to or fall from this magnitude; and
selecting the magnitude and ramp time to elicit no neurological response when the magnetic field gradient is generated in the presence of the structure and neurological tissue,
wherein the selected ramp time is less than 10 microseconds.

9. The method according to claim 8, the selected ramp time is within a range of 1 microsecond to 10 microseconds.

* * * * *